United States Patent
Moors et al.

(10) Patent No.: US 7,369,216 B2
(45) Date of Patent: May 6, 2008

(54) LITHOGRAPHIC SYSTEM, METHOD FOR ADAPTING TRANSMISSION CHARACTERISTICS OF AN OPTICAL PATHWAY WITHIN A LITHOGRAPHIC SYSTEM, SEMICONDUCTOR DEVICE, METHOD OF MANUFACTURING A REFLECTIVE ELEMENT FOR USE IN A LITHOGRAPHIC SYSTEM, AND REFLECTIVE ELEMENT MANUFACTURED THEREBY

(75) Inventors: Johannes Hubertus Josephina Moors, Helmond (NL); Uwe Mickan, Veldhoven (NL); Wolfgang Singer, Aalen (DE); Hans-Juergen Mann, Veldhoven (NL)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 183 days.

(21) Appl. No.: 10/964,817

(22) Filed: Oct. 15, 2004

(65) Prior Publication Data
US 2006/0082751 A1    Apr. 20, 2006

(51) Int. Cl.
G03B 27/72    (2006.01)
G03B 27/54    (2006.01)

(52) U.S. Cl. .......................................... 355/69; 355/67

(58) Field of Classification Search .................. 355/52, 355/53, 55, 67–71; 356/399–401; 250/548
See application file for complete search history.

(56) References Cited

U.S. PATENT DOCUMENTS

| | | | | |
|---|---|---|---|---|
| 6,404,499 | B1 * | 6/2002 | Stoeldraijer et al. | 356/400 |
| 6,501,534 | B1 * | 12/2002 | Singh et al. | 355/55 |
| 6,563,567 | B1 * | 5/2003 | Komatsuda et al. | 355/71 |
| 7,030,958 | B2 * | 4/2006 | Luijkx et al. | 355/30 |
| 2005/0006605 | A1 * | 1/2005 | Won et al. | 250/548 |

\* cited by examiner

*Primary Examiner*—Henry Hung Nguyen
(74) *Attorney, Agent, or Firm*—Pillsbury Winthrop Shaw Pittman, LLP

(57) ABSTRACT

A lithographic system includes a radiation system configured to provide a beam of radiation; an illumination system configured to condition the beam of radiation; a support configured to support a patterning device, the patterning device configured to impart the projection beam with a pattern in its cross-section; a substrate table configured to hold a substrate; a projection system configured to project the patterned beam onto a target portion of the substrate; and transmission adaptor arranged along an optical pathway. The radiation system includes a source configured to generate a beam of radiation. The transmission adaptor adapts an intensity profile as a function of wavelength of the beam of radiation and/or the patterned beam in such a way that the intensity profile equals a predetermined intensity profile.

28 Claims, 4 Drawing Sheets

LITHOGRAPHIC SYSTEM, METHOD FOR ADAPTING TRANSMISSION CHARACTERISTICS OF AN OPTICAL PATHWAY WITHIN A LITHOGRAPHIC SYSTEM, SEMICONDUCTOR DEVICE, METHOD OF MANUFACTURING A REFLECTIVE ELEMENT FOR USE IN A LITHOGRAPHIC SYSTEM, AND REFLECTIVE ELEMENT MANUFACTURED THEREBY

BACKGROUND OF THE INVENTION

1. Field of the Invention

The present invention relates to a lithographic system, a method for adapting transmission characteristics of an optical pathway within a lithographic system, a semiconductor device, a method of manufacturing a reflective element for use in a lithographic system, and a reflective element manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction, i.e. the "scanning" direction, while synchronously scanning the substrate parallel or anti-parallel to this direction.

Lithographic apparatus may soon employ EUV radiation sources, e.g. based on a plasma discharge. As opposed to the radiation sources that are currently used in lithographic apparatus having an extremely small bandwidth, i.e. laser sources, these sources are broad-band light sources, i.e. sources which generate radiation of a wide range of wavelengths. In a lithographic apparatus employing EUV radiation, the spectral distribution of the EUV-light emitted by the source is altered by the apparatus. More specifically, the imaging related spectral effects depend on both the transmission properties of optical elements in the lithographic apparatus as well as on the emitted source spectrum. The current knowledge about the detailed spectrum around a wavelength of EUV-light, i.e. a wavelength within a range of 5-20 nm, for example about 13.5 nm, is limited. The current resolution of the spectrum is in the order of 0.05 nm with a 2% bandwidth. Furthermore the real spectrum of the source seems to change by a change in parameters like input power, electrode configuration of the source, emitting material (Xe, Sn or other suitable material) used and history of electrodes of the source due to changes in the plasma.

Due to the lack of knowledge, it is highly probable that an optical pathway, i.e. an optical trajectory of the radiation between its generation by the source and the projection on the target portion of the substrate, within the lithographic apparatus is not optimized for EUV-radiation. The mismatch between the spectrum emitted by the source, and the spectrum expected by the optical components along the optical pathway will lead to errors, for example a chromatical error seen in the apodization i.e. a distortion in an intensity profile. The first order effect of this error will be a telecentricity error and in a later stage a horizontal-vertical bias, i.e. a difference in intensity at the substrate level between light passing horizontal elements and light passing vertical elements within a pattern structure to be exposed, will increase dramatically as is known to those of ordinary skill in the art.

SUMMARY OF THE INVENTION

It is an aspect of the present invention to provide a lithographic apparatus, in which the intensity profile of the radiation, for example EUV-radiation, is substantially equalized when arriving at the target portion of the substrate. The present invention therefore provides a lithographic system including a radiation system configured to provide a beam of radiation; an illumination system configured to condition the beam of radiation; a support configured to support a patterning device, the patterning device configured to impart the beam of radiation with a pattern in its cross-section; a substrate table configured to hold a substrate; a projection system configured to project the beam of radiation, after it has been patterned, onto a target portion of the substrate; and an transmission adaptor configured to adapt a first intensity profile of the beam of radiation as a function of wavelength of the beam of radiation so as to be substantially equal to a predetermined intensity profile. The first intensity profile may be adapted before or after the beam of radiation is patterned. With this lithographic system apodization- and telecentricity errors will be accounted for.

In an embodiment a source of radiation includes a source chamber, filled with a gaseous mixture, and the transmission adaptor is configured to adapt density, pressure and/or composition of the gaseous mixture in the source chamber. These properties are all highly adaptable and may be changed within a short period of time.

In an embodiment, the transmission adaptor is an element of a dynamic arrangement. In an example thereof, the lithographic system further includes a measurement device to measure either the first or a second intensity profile, and to provide a measured intensity profile signal; and a control unit to control the transmission adaptor by determining at least one control signal based on the measured intensity profile signal and providing the at least one control signal to the transmission adaptor. The introduction of these two enables an active observation and control of the intensity profile as function of wavelength. As a result, small changes that may lead to errors like apodization- and telecentricity errors may be corrected for during operation of the lithographic system.

In an embodiment, the transmission adaptor is an element of a static arrangement. Examples of such transmission adaptor are a d-spacing of the patterning device, a capping layer of the patterning device and an exchangeable filter. The transmission adaptor in a static arrangement compensates for structural irregularities in a wavelength-dependent intensity profile.

The invention further relates to a method for adapting transmission characteristics of an optical pathway within a lithographic system, the method including providing a beam of radiation; patterning the beam of radiation with a pattern in its cross-section projecting the patterned beam of radiation onto a target portion of the substrate; and adapting a first intensity profile of the beam of radiation as a function of wavelength of the beam of radiation so as to be substantially equal to a predetermined profile. The method provides that the intensity profile of the radiation is substantially equalized when arriving at the target portion of the substrate. The first intensity profile may be adapted before or after the beam of radiation is patterned.

In an embodiment the method further includes measuring either the first or a second intensity profile; providing a measured intensity profile signal; and using the measured intensity profile signal for adapting the first intensity profile and/or a second intensity profile. This enables an active observation and control of the intensity profile as function of wavelength. As a result, the method may correct small changes that can lead to errors like apodization- and telecentricity errors during operation of the lithographic system.

The present invention further relates to a semiconductor device produced according to the aforementioned method.

The invention further relates to a method of manufacturing a reflective element for use in a lithographic system, the reflective element including a mirror substrate, a first layer having a first thickness, and a second layer having a second thickness, each layer having a different transparency for radiation employed by the lithographic system, wherein the method includes measuring an intensity profile as a function of wavelength of radiation emitted by a predetermined source; calculating separate values for at least one of the first thickness and second thickness based on the measured intensity profile as to adapt the intensity profile such that it substantially equals a predetermined profile within a predetermined bandwidth of the radiation when impinging on the reflective element; providing the mirror substrate; providing the first layer, wherein the first layer has the first thickness; providing the second layer, wherein the second layer has the second thickness.

By using this method to manufacture a reflective element structural irregularities in a wavelength dependent intensity profile may be compensated for.

In an embodiment the method further includes calculating a third thickness of a capping layer based on the measured intensity profile and providing the capping layer on the first and second layers, wherein the capping layer has the third thickness. The capping layer provided by this method may further optimize the wavelength dependent intensity profile of the radiation traveling along the optical pathway.

The invention further relates to a reflective element as produced according to aforementioned method.

The invention further relates to an assembly for use in a lithographic apparatus including a diffractive optical element for dividing a beam of radiation, which impinges on the diffractive optical element, in a plurality of beamlets, each beamlet diffracted in a different direction, and including light with a separate, predefined bandwidth of wavelengths, the bandwidth, being smaller than the bandwidth of the beam of radiation; and a light modulator to modulate the plurality of beamlets.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bares the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables and/or two or more mask tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
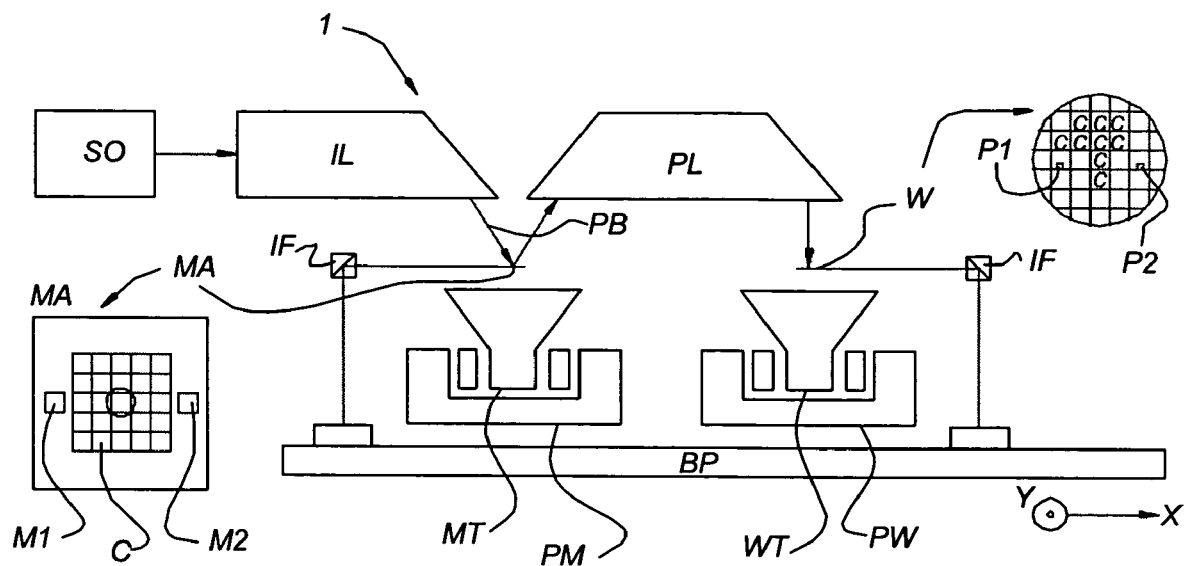
FIG. 1 depicts a lithographic apparatus according to an embodiment of the present invention.

FIG. 1 schematically depicts a lithographic apparatus 1 according to an embodiment of the invention. The apparatus 1 includes a base plate BP and an illumination system (illuminator) IL configured to provide a beam PB of radiation (e.g. UV or EUV radiation) A support (e.g. a mask table) MT is configured to support a patterning device (e.g. a mask) MA and is connected to a first positioning device PM that accurately positions the patterning device with respect to a projection systyem PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a reflective projection lens) PL is configured to image a pattern imparted to the beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including, for example, suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width, in the non-scanning direction, of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The invention will now be explained by examples for a lithography apparatus employing EUV-radiation. It must be understood that the invention is not limited to this type of radiation. Other types of radiation may be applied.

Figure 2:
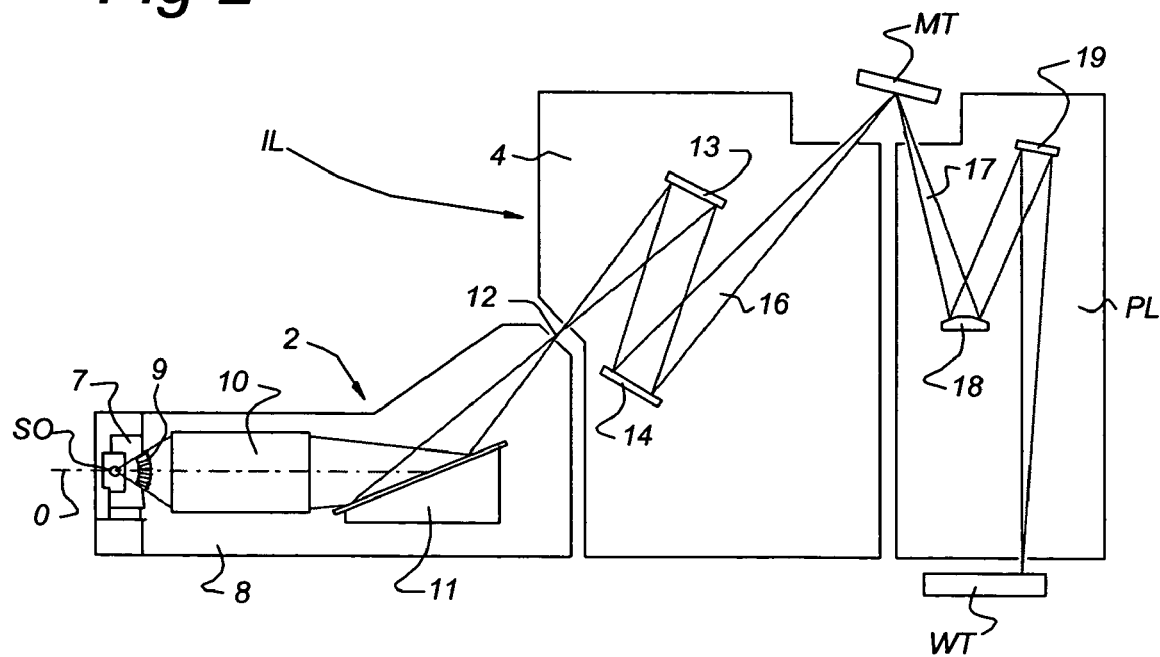
FIG. 2 depicts an EUV lithographic apparatus according to an embodiment of the present invention

FIG. 2 shows the projection apparatus 1 of FIG. 1 in more detail, including a radiation system 2, an illumination optics unit 4, and the projection system PL. The radiation system 2 includes the radiation source SO, which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a "partially ionized" plasma of an electrical discharge to collapse onto an optical axis O. Partial pressures of, for example, 10 Pa of Xe or Li vapor or any other suitable gas or vapor may be required for efficient generation of the radiation. The radiation emitted by radiation source SO is passed from a source chamber 7 into a collector chamber 8, e.g. via a gas barrier or contamination trap 9 which is positioned in or behind an opening in source chamber 7. The gas barrier 9 may include a channel structure, for example as described in detail in U.S. Pat. Nos. 6,359,969 and/or 6,614,505, which are incorporated herein by reference.

The collector chamber 8 includes a radiation collector 10 which may be formed by a grazing incidence collector. Radiation passed by collector 10 is reflected off a grating spectral filter 11 to be focused in a virtual source point 12 at an aperture in the collector chamber 8. From collector chamber 8, a beam 16 is reflected in illumination optics unit 4 via normal incidence reflectors 13, 14 onto reticle or mask MA positioned on reticle or mask table MT. A patterned beam 17 is formed which is imaged in projection system PL via reflective elements 18, 19 onto wafer stage or substrate table WT. More elements than shown may generally be present in illumination optics unit 4 and projection system PL. For example, an EUV lithographic apparatus may have nine reflective elements, two in the illumination system IL, six in the projection system PL, and a reflective mask MA.

The spectral distribution of the EUV-light emitted by the source SO changes along an optical pathway, the optical pathway being defined as an optical trajectory of radiation including an optical trajectory of a beam of radiation between its generation by source SO and illumination system IL and an optical trajectory of a beam 16 between illumination system IL and a target portion of substrate W.

Figure 3A:
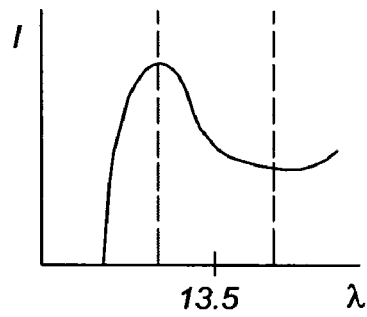
FIG. 3a depicts an example of an intensity profile as function of wavelength of an EUV-source.

For example, consider the exemplary intensity I profile as a function of wavelength of EUV-radiation as generated by source SO, as shown in FIG. 3a. It is recognized that this profile is wavelength-dependent. It originates from the fact that the spectrum includes a summation of numerous spectral lines with different line strengths. Generally, a lithographic apparatus is designed such that a limited, predetermined bandwidth of radiation along the optical pathway is transmitted. In all FIGS. 3a-3e, the spectral bandwidth, i.e. the transmission bandwidth in nanometers, is denoted by the area between the two vertical interrupted lines. However, it is recognized that the radiation emitted by source SO is still wavelength-dependent within the bandwidth of interest.

Figure 3B:
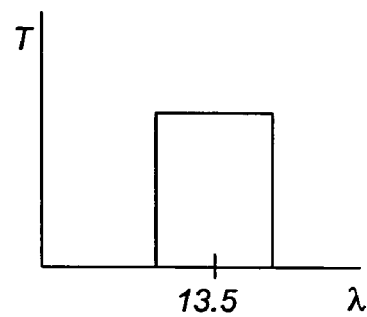
FIG. 3b depicts an example of a transmission profile as function of wavelength of an optical system.
Figure 3C:
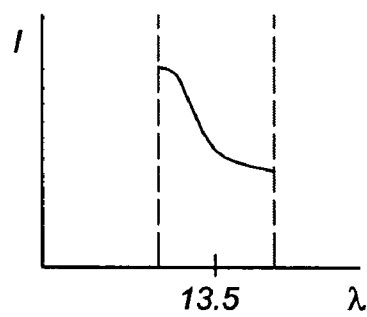
FIG. 3c depicts an example of an intensity profile as function of wavelength on a target portion of a substrate to be processed.

A lithographic apparatus is generally optimized to allow a substantially wavelength-independent transmission along the optical pathway within a predetermined bandwidth, as is depicted in FIG. 3b. Thus a transmission T within this bandwidth is uniform, while radiation with a wavelength outside the bandwidth is not transmitted at all. It is absorbed along the optical pathway. The combination of a wavelength-dependent emission profile as shown in FIG. 3a combined with a substantially wavelength-independent transmission profile of the lithographic apparatus within the bandwidth as shown in FIG. 3b results in a wavelength-dependent exposure of the substrate to be exposed as is shown in FIG. 3c within the bandwidth of the system. As a result of this wavelength-dependency, features provided on the patterning device are projected on the substrate to be exposed at an intensity, which is partly determined by the orientation of the feature. Additionally, a telecentricity error develops, i.e. a tilt of the radiation beam incident on the substrate to be exposed results in a shift in focus, which leads to errors. Moreover, polarization at mirrors, especially in the projection system PL, may enhance these intensity differences. However, the desired intensity profile as a function of wavelength at substrate level is substantially wavelength-independent, like the one depicted in FIG. 3d.

Figure 3D:
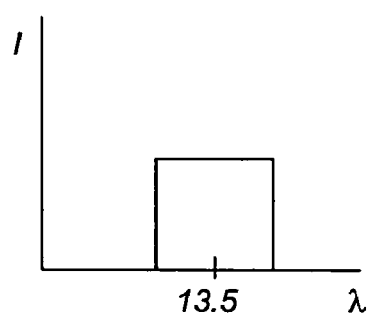
FIG. 3d depicts an example of a desired intensity profile as function of wavelength on a target portion of a substrate to be processed.
Figure 3E:
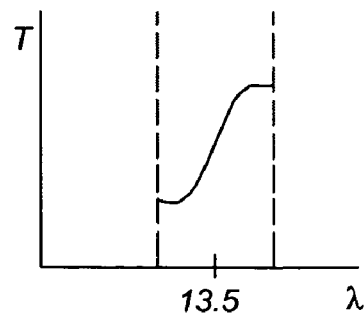
FIG. 3e depicts a required transmission profile as function of wavelength of the optical system when the actual intensity profile as function of wavelength is the intensity profile of FIG. 3a and the desired intensity profile as function of wavelength is the intensity profile of FIG. 3d.

In order to accomplish a wavelength-independent intensity profile at substrate level, as shown in FIG. 3d, the present invention provides an adaptive system along the optical pathway. The adaptive system is configured to alter the transmission profile of the lithographic apparatus along the optical pathway in such a way that the intensity profile as function of wavelength at substrate level is equalized within the aforementioned predetermined bandwidth. It thus compensates for an unequal intensity distribution of the radiation emitted by the source. FIG. 3e shows an example of an adapted transmission profile as function of wavelength corresponding to the intensity profile generated by source SO as shown in FIG. 3a. It can be recognized that a combination of the intensity profile of FIG. 3a and the transmission profile of FIG. 3e results in the desired substantially wavelength-independent intensity profile depicted in FIG. 3d.

Figure 4:
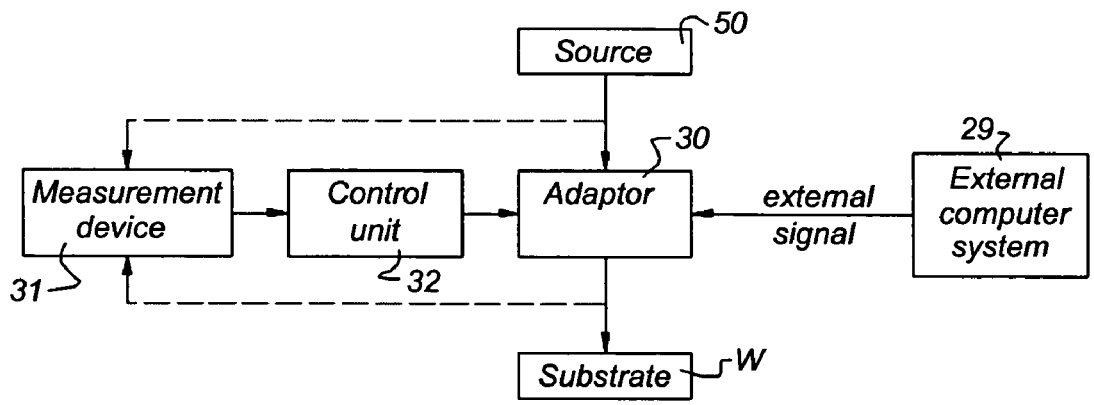
FIG. 4 depicts an embodiment of the present invention.

In a first, dynamic, embodiment of the present invention, the adaptive system is configured to respond to a signal regarding a proposed change in a transmission profile as function of wavelength. FIG. 4 depicts a schematic block diagram of such a system. Within the lithographic apparatus an adaptive system 30 is located along the optical pathway between a source SO and a substrate W. The signal is either an external signal that is provided by an external computer system 29 or a control signal generated by a control unit 32 that is connected to a measurement device 31. An active observation of the intensity profile as function of wavelength may help to minimize predictable errors, caused by the undesired intensity profile, and thus may help to improve the performance of a lithographic apparatus. A measurement device 31 is configured to measure the intensity profile as a function of wavelength of the radiation at a predetermined location within a lithographic apparatus. Consecutively, the measurement device 31 sends the measured data towards control unit 32. Control unit 32 calculates what changes are needed to correct the transmission profile (FIG. 3e), measured by the measurement device 31, in order to establish the desired intensity profile on the target portion of the substrate W to be processed FIG. 3d, and generates a control signal, including correction values to make the corrections. The control signal is sent towards the adaptive system 30, which, in response to the control signal, makes necessary arrangements to alter the transmission profile of the radiation in the lithographic apparatus. If the measurement device 31 is located between the source SO and the adaptive system 30, the control signal sent by the control unit 32 will be a feed-forward signal. Likewise, if the measurement device 31 is located between the substrate W and the adaptive system 30, the control signal sent by the control unit 32 will be a feedback signal.

The measurement device 31 may be configured to measure the intensity spectrum as A function of wavelength in close proximity of the source SO. To perform wavelength measurements, constructive interference may be used to derive phase differences, which are an integer times the observed wavelength. A known technique to accomplish this is to illuminate a grating, and measure the reflected light at different angles. The angle of constructive interference depends on the wavelength, thus the angular spectrum includes wavelength information. To enhance the wavelength separation a pin hole may be positioned between the source and the grating. The source then acts as a point source. By adapting state-of-the-art measurement devices, for example wavelength meters or wavelength etalons, a suitable measurement device can be constructed. The measured intensity profile can be used for a feedback or feed-forward signal, sent towards the adaptive system 30, for example via control unit 32. Positioning the measurement device 31 in close proximity of the source SO solves the problem introduced by the wavelength-dependent intensity distribution of the emitted radiation. The measurement device 31 may include one or more gratings, array(s) of diodes and CCD-chips to measure the intensity at different positions for different angles. Besides gratings, other diffractive structures may be used, for example small holes or sub-wavelength parts.

The measurement device 31 may also be arranged at other locations inside the lithographic apparatus. For example, the measurement device 31 may be positioned inside the illumination system IL, and be based upon an etalon-like tooling, for example a multilayer reflector and/or grating combined with a well-positioned sensor or the like to measure a change of angle as a result of a shift in the measured profile. Preferably, the angle of the grating is altered while the sensor is fixed. In this way a spectrum can be obtained. While changing the angle, the wavelength for which constructive interference occurs changes. Since current lithographic systems include a number of moving elements, e.g. reflective elements 18, 19 in an EUV-lithography system, which can be controlled in an extremely accurate manner, implementation can be performed relatively easily.

Alternatively, the measurement device 31 may be positioned on substrate table WT or mask table MT or on fiducial plates, i.e. additional plates provided for alignment purposes, which are preferably positioned in close proximity to these structures, and may include a diffraction grating and one or more sensors. A sensor array may be provided to measure the pattern on fixed places. For example, the telecentricity error and/or horizontal-vertical bias at substrate level may be measured. This type of indirect profile observation by measuring inside provides that some parts of the lithographic apparatus are actively involved in adapting the transmission profile of the entire system. Moreover, the lithographic apparatus itself is used as a measurement tool. It can therefore also operate stand-alone.

Figure 5:
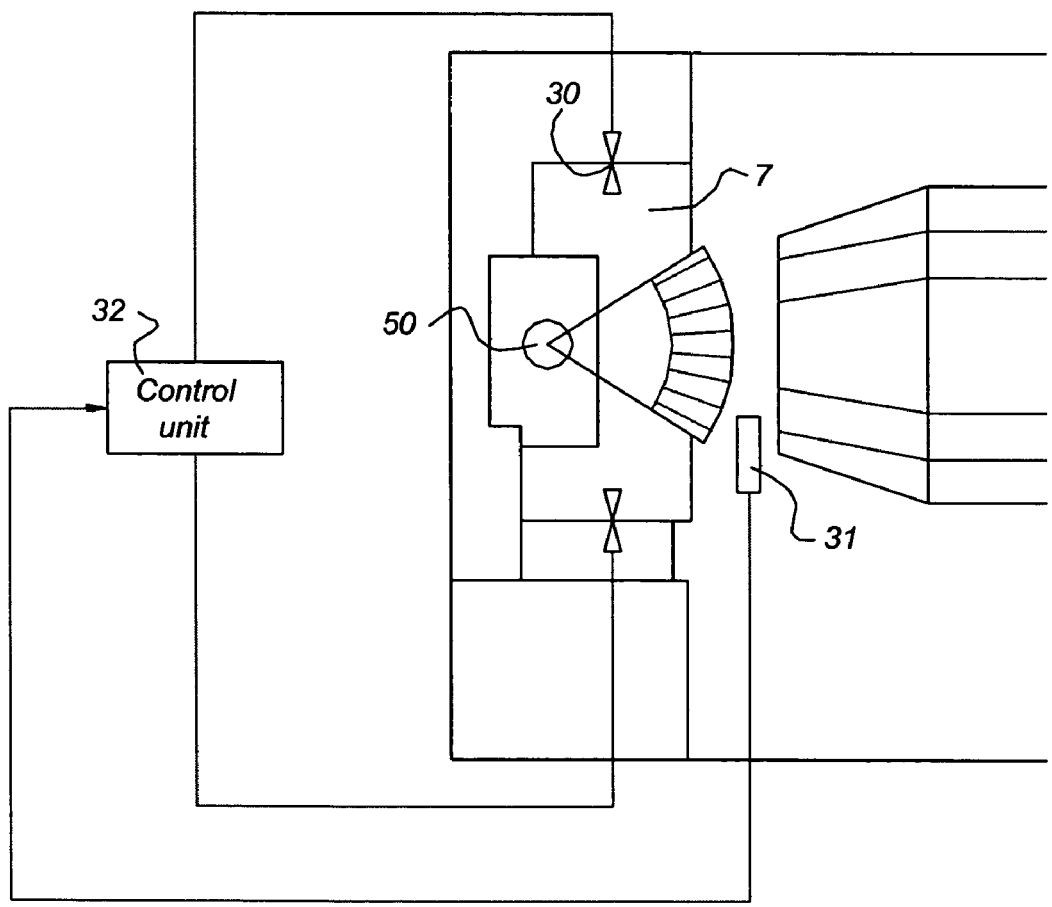
FIG. 5 depicts a first example of the embodiment shown in FIG. 4.

FIG. 5 shows a more detailed view of a portion of the radiation system 2 shown in FIG. 2. A first example of the embodiment shown in FIG. 4 includes the adaptive system 30 configured to dynamically adapt the properties of a gaseous mixture in source chamber 7. The gaseous mixture may include a number of different gases and vapors. The transmission adaptor 30 may control parameters like density, composition and pressure via adaptive elements, for example valves. Similar arrangements may also be provided to control the density, composition and pressure of a gaseous mixture in other chambers within the lithographic system. Gases that may be employed include Ar, Xe, Kr, Li, $H_2$, $N_2$ and $O_2$. Vapors that may be employed include vapors including elements such as Sn and In. Dependent on chosen values for at least one of the control parameters, the transmission properties of the source chamber 7 change by a change of the absorption spectrum of the gaseous mixture. The intensity profile as function of wavelength of the emitted radiation may thus be altered into a more wavelength-independent intensity profile. The presence of measurement device 31 introduces the possibility to adapt the transmission spectrum in reaction to the changes in the actual transmission spectrum of the system. The measurement device 31 may be arranged in close proximity to the source SO. This position has the advantage that the transmission adaptor 30, which receive its instructions derived from the measurement results in the form of a feed-forward or feedback signal, may react within a small timeframe. It is however also possible to measure the intensity profile of the radiation with measurement device 31 at other positions along the optical pathway.

Figure 6:
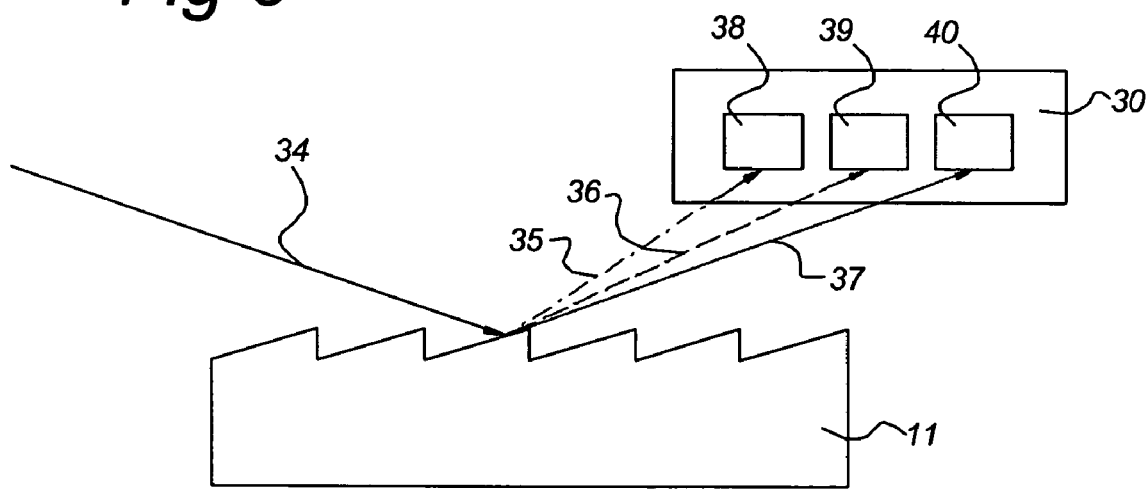
FIG. 6 depicts a second example of the embodiment shown in FIG. 4.

FIG. 6 schematically shows a second example of the embodiment shown in FIG. 5, wherein transmission adaptor 30 is positioned in the optical pathway downstream of grating spectral filter 11. Grating spectral filter 11 selectively reflects radiation 34, arriving through the radiation collector 10, depending on the wavelength of the radiation 34. For example, if the radiation 34 includes three radiation components 35-37 with different wavelengths $\lambda_I$, $\lambda_{II}$, $\lambda_{III}$, the radiation 34 will be reflected by the spectral filter 11 in three directions; a radiation component 35 with a wavelength of $\lambda_I$ is reflected in a first direction, a radiation component 36 with wavelength $\lambda_{II}$ in a second direction and a radiation component 37 with wavelength $\lambda_{III}$ in a third direction. In this embodiment, transmission adaptor 30 is arranged to receive the reflected radiation components 35-37 and adapt them as a result of unequal treatment of the separate radiation components 35-37. The radiation component 35 with wavelength $\lambda_I$ is adapted by adaptive element 38, while the radiation components with wavelengths $\lambda_{II}$ and $\lambda_{III}$ are adapted by adaptive elements 39 and 40, respectively. The adaptive elements 38-40 may include several elements. For example, they may include a reflector provided with an absorbing layer. When each adaptive element 38, 39, and 40 is provided with a different absorbing layer, the transmission profile of the optical pathway will change as function of wavelength. Again, in an embodiment of the present invention provided with transmission adaptor 30 in the optical pathway downstream the grating spectral filter 11, it is possible to change the properties of the transmission adaptor 30, for example by using signals provided by measurement device 31, for example via control unit 32. For example, if each adaptive element 38-40 includes one or more blades, as for example disclosed in U.S. Pat. No. 6,741,329, incorporated herein by reference, the transmissivity of specific wavelengths along the optical pathway may be varied upon reception of such a signal by selectively rotating the one or more blades to increase or decrease their width perpendicular to the optical pathway. The transmission adaptor 30 may include any type of light modulator, for example a deformable mirror, a micromechanical shutter, a rotating blade or lamella, or a movable finger including a window including a thin layer of a material that includes suitable absorption properties at one or more specified wavelengths, either as a single unit or in an array format. The transmission adaptor may be positioned in a focal plane of the reflected radiation. The transmission adaptor 30 may alter optical properties, including beam direction and beam intensity, either for the entire beam, or only for a predetermined section of the beam, for example a section with a specific wavelength. The dynamic adaptivity allows fast changes in the transmission profile to be compensated for. The measurement device 31 is arranged along the optical pathway, and may be located upstream and downstream of the transmission adaptor 30.

Similar arrangements for the transmission adaptor as described in relation to the grating spectral filter 11 may also be employed in relation to lenses, for example the normal incidence reflectors 13, 14 and reflective elements 17, 18.

Figure 7:
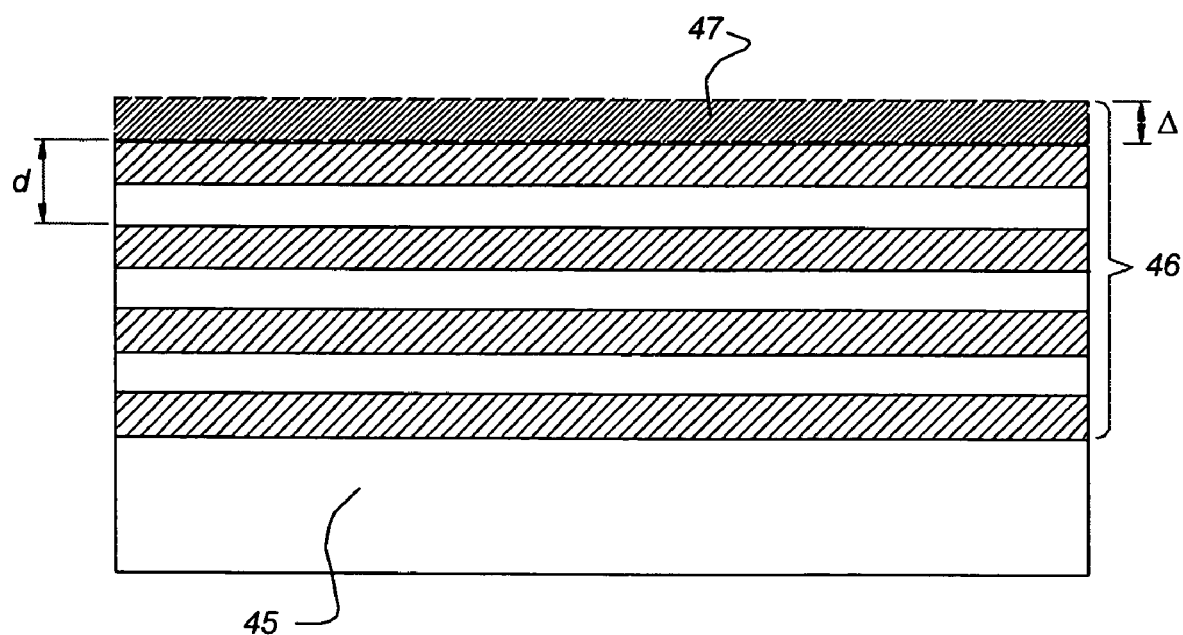
FIG. 7 depicts a combination of two options according to another embodiment of the present invention.

In a second, static, example of the embodiment shown in FIG. 4, optical elements within the lithographic apparatus are adapted, or additional elements are included, to alter the transmission characteristics of the optical pathway. There are several options to establish the adaptations. Referring to FIG. 7, in an EUV lithographic apparatus all optical elements are generally reflective. The reflective surface of an optical element 45 generally includes a multi-layer coating 46. Multi-layer coating 46 includes at least two alternating layers with a different transparency. Generally, a first layer of the at least two alternating layers includes a material selected from a group including Mo, Nb and combinations thereof, while a second layer of the at least two alternating layers in the multi-layer coating 46 includes a material selected from a group including Be, B, C, $B_4C$, SiC, Si and combinations thereof. The distance between two identical layers within a multi-layer coating 46 is denoted by d. The spacing of the layers, which is therefore called d-spacing, has an influence on the optical characteristics of the entire multi-layer coating 46. When light is projected on the multi-layer coating 46, the spacing of the layers alters the interference of the radiation beams, which reflect from each layer within the multi-layer coating 46. Furthermore, the spacing can increase or decrease the absorption of a coating 46 at a certain wavelength. Thus changing the d-spacing has a similar effect as changing an angle of a reflective element like a mirror with respect to the optical pathway. A first option to adapt the transmission characteristics of the optical pathway in the second embodiment of the present invention is therefore to change the d-spacing of one or more optical elements 45. The described adaptation can for example be used in one or more of the optical elements, like normal incidence reflectors 13, 14, which are used in illumination system IL. In an embodiment of the present invention, the d-spacing of the reticle is adapted.

A second option to change the transmission characteristics of the optical pathway of the lithographic apparatus by adapting an optical element according to the second example is to alter a thickness of a top layer of the optical element 45, e.g. one or more of the normal incidence reflectors 13, 14 in illumination system IL or the reticle MA, is changed. This top layer, also called capping layer 47, generally includes inert metals, e.g. Au, inert materials, e.g. $SiO_2$ or transition metals (e.g. Pt, Ru) and its thickness Δ can alter the transmission characteristics of the optical pathway, since the absorption in this layer is wavelength dependent. The way in which the capping layer changes the spectrum is determined by the material it includes.

Of course, both options can be combined i.e. an optical element 45 including an adapted capping layer 47 and adapted d-spacing, as is shown in FIG. 7. The use of the second example only corrects for the spectral skewness that is expected. First, the transmission characteristics of the optical pathway within the lithographic apparatus is measured. Consecutively, values for the d-spacing and/or the thickness of the separate layers within the multi-layer coating 46 and capping layer 47 are calculated, and the, generally reflective, at least one optical element 45 to be adapted is manufactured in accordance with the calculated values. After installment of the at least one optical element 45 with adapted d-spacing of coating 46 and/or capping layer 47, the measured spectral variation is adapted for. In an embodiment of the present invention the capping layer of a reticle is adapted. Since a reticle can easily be installed and removed, adapting the reticle has the advantage that its d-spacing and capping layer can be adapted more easily and frequently.

Additional elements that may be positioned in the optical pathway include exchangeable filters, such as windows, including a small film of a material with suitable wavelength dependent absorption characteristics. The material may, for example, include elements like zirconium (Zr) and niobium (Nb), although the use of other elements is also possible. The thickness of the film should be small to limit the intensity reduction of the light passing through the window.

In a third, static, example of the embodiment shown in FIG. 4, the transmission characteristics of the optical pathway are changed by transmission adaptor 30 as depicted in FIG. 6. However, in this example, there is no control unit 32 connected to the transmission adaptor 30, which dynamically alters its settings. It is however possible to connect an transmission adaptor 30 in this example to a setting device, which sets the transmission adaptor 30 in a certain mode to compensate for the spectral variation induced along the optical pathway. The extent of the compensation may depend on measurements on the spectral skewness of the optical pathway, which are regularly performed, for example at each reticle change.

It should be appreciated that the present invention is not limited to the use of only one type of transmission adaptor in a lithographic apparatus. Various modifications are possible within the scope of the present invention including the use of more than one transmission adaptor.

While specific embodiments of the present invention have been described above, it will be appreciated that the present invention may be practiced otherwise than as described. The invention is not limited to a lithographic apparatus employing EUV-radiation. Also other types of radiation may be applied. The description is not intended to limit the present invention.

It is to be understood that the annexed claims refer to a "lithographic system" which is used to refer to both a situation where the source of radiation SO is part of the lithographic apparatus and an alternative situation where the radiation source SO is no part of the lithographic apparatus.

What is claimed is:

1. A lithographic system, comprising:
   an illumination system configured to condition a beam of radiation;
   a support configured to support a patterning device, the patterning device configured to impart the beam of radiation with a pattern in its cross-section to provide a patterned beam of radiation;

a substrate table configured to hold a substrate;

a projection system configured to project the beam of radiation, after it has been patterned, onto a target portion of the substrate; and a transmission adaptor configured to adapt a first intensity profile of the beam of radiation as a function that varies for each of a plurality of wavelengths of the beam of radiation toward or to be equal to a desired intensity profile.

2. A lithographic system according to claim 1, wherein the desired intensity profile is an equalized profile.

3. A lithographic system according to claim 1, wherein the transmission adaptor is an element of a dynamic arrangement.

4. A lithographic system according to claim 3, wherein the dynamic arrangement comprises:

a measurement device configured to measure either the first intensity profile or a second intensity profile, and to provide a measured intensity profile signal; and a control unit configured to control the transmission adaptor by determining at least one control signal based on the measured intensity profile signal and providing the at least one control signal to the transmission adaptor.

5. A lithographic system according to claim 4, wherein the measurement device is located along an optical pathway between a source of the radiation and the transmission adaptor, and the at least one control signal provided by the control unit is a feed-forward signal.

6. A lithographic system according to claim 4, wherein the measurement device is located along an optical pathway between the transmission adaptor and the substrate table, and the at least one control signal provided by the control unit is a feedback signal.

7. A lithographic system according to claim 4, wherein the transmission adaptor comprises at least one light modulator, the at least one light modulator being configured to dynamically modulate at least one optical property of a fraction of the beam of radiation upon reception of the at least one control signal provided by the control unit.

8. A lithographic system according to claim 7, wherein the at least one optical property is selected from a group comprising beam direction, beam direction per wavelength, beam intensity and beam intensity per wavelength.

9. A lithographic system according to claim 1, wherein the transmission adaptor is an element of a static arrangement.

10. A lithographic system according to claim 9, wherein the lithographic system comprises the patterning device and the transmission adaptor is selected to be one of a group comprising a d-spacing of the patterning device, a capping layer of the patterning device and an exchangeable filter.

11. A lithographic system according to claim 9, wherein the transmission adaptor in the static arrangement comprises a reflective element comprising a mirror substrate, a first layer having a first thickness and a second layer having a.second thickness, each layer having a different transparency for radiation employed by the lithographic system.

12. A lithographic system according to claim 11, wherein the reflective element further comprises a capping layer having a third thickness.

13. A lithographic system according to claim 1, further comprising a source, the source comprising a source chamber configured to be filled with a gaseous mixture, and the transmission adaptor is configured to adapt at least one of density, pressure and composition of the gaseous mixture in the source chamber.

14. A lithographic system according to claim 13, wherein the gaseous mixture comprises at least one element selected from a group of gases comprising Ar, Xe, Kr, Li, $N_2$, $O_2$, $H_2$, and a group of vapors comprising Sn and In.

15. A lithographic system according to claim 1, wherein the transmission adaptor is configured to adapt the first intensity profile before the beam of radiation has been patterned.

16. A lithographic system according to claim 1, wherein the transmission adaptor is configured to adapt the first intensity profile after the beam of radiation has been patterned.

17. A method for adapting transmission characteristics of an optical pathway within a lithographic system, comprising:

providing a beam of radiation;

patterning the beam of radiation in its cross-section;

projecting the patterned beam of radiation onto a target portion of a substrate; and adapting a first intensity profile of the beam of radiation as a function that varies for each of a plurality of wavelengths of the beam of radiation toward or to be equal to a desired intensity profile.

18. A method according to claim 17, wherein the desired intensity profile is an equalized profile.

19. A method according to claim 17, further comprising:

measuring either the first intensity profile or a second intensity profile;

providing a measured intensity profile signal; and using the measured intensity profile signal for the adapting of the first intensity profile.

20. A method according to claim 17, wherein the first intensity profile is adapted before the beam of radiation is patterned.

21. A method according to claim 17, wherein the first intensity profile is adapted after the beam of radiation is patterned.

22. A lithographic system, comprising:

an illumination system configured to condition a beam of radiation;

a support configured to support a patterning device, the patterning device configured to impart the beam of radiation with a pattern in its cross-section to provide a patterned beam of radiation;

a substrate table configured to hold a substrate;

a projection system configured to project the beam of radiation, after it has been patterned, onto a target portion of the substrate;

a transmission adaptor configured to adapt an intensity profile of the beam of radiation as a function that varies for each of a plurality of wavelengths of the beam of radiation and configurable to provide different adaptations of the intensity profile.

23. A lithographic system according to claim 22, further comprising a measurement device configured to measure the intensity profile or a second intensity profile and wherein the transmission adaptor is configured to adapt the intensity profile based on the measured intensity profile.

24. A lithographic system according to claim 23, wherein the measurement device is located along an optical pathway between a source of the radiation and the transmission adaptor, and the measured intensity profile is a feed-forward signal to the transmission adaptor.

25. A lithographic system according to claim 22, wherein the transmission adaptor comprises at least one light modulator, the at least one light modulator being configured to dynamically modulate at least one optical property of a fraction of the beam of radiation.

26. A lithographic system according to claim 25, wherein the at least one optical property is selected from a group comprising beam direction, beam direction per wavelength, beam intensity and beam intensity per wavelength.

27. A lithographic system according to claim 22, wherein the transmission adaptor is configured to adapt at least one of density, pressure and composition of a gaseous mixture in a source chamber of a source configured to provide the radiation.

28. A lithographic system according to claim 22, wherein the transmission adaptor is configured to adapt the intensity profile before the beam of radiation has been patterned.

* * * * *